(12) United States Patent
Ehlert (10) Patent No.: US 11,589,441 B2
(45) Date of Patent: Feb. 21, 2023

(54) LASER PROJECTION DEVICE, METHOD FOR OPERATING SAME, AND LASER PROJECTOR

(71) Applicant: Robert Bosch GmbH, Stuttgart (DE)

(72) Inventor: Alexander Ehlert, Eutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 231 days.

(21) Appl. No.: 16/755,985

(22) PCT Filed: Sep. 12, 2018

(86) PCT No.: PCT/EP2018/074677
§ 371 (c)(1),
(2) Date: Apr. 14, 2020

(87) PCT Pub. No.: WO2019/101383
PCT Pub. Date: May 31, 2019

(65) Prior Publication Data
US 2020/0305255 A1 Sep. 24, 2020

(30) Foreign Application Priority Data
Nov. 22, 2017 (DE) .......................... 102017220811.2

(51) Int. Cl.
*H05B 47/10* (2020.01)
*G02B 26/10* (2006.01)
(Continued)

(52) U.S. Cl.
CPC ......... *H05B 47/105* (2020.01); *G02B 26/101* (2013.01); *H01S 5/0071* (2013.01);
(Continued)

(58) Field of Classification Search
CPC ..... H05B 47/10; H05B 47/105; H01S 5/0071; H04N 9/3135; H04N 9/3155; H04N 9/3185; G02B 26/101
See application file for complete search history.

(56) References Cited

U.S. PATENT DOCUMENTS 10,080,001 B2 * 9/2018 Saito ................... H04N 9/3185
2008/0297876 A1 12/2008 Drumm
(Continued)

FOREIGN PATENT DOCUMENTS

DE 102004027674 A1 1/2006
DE 102007025328 A1 12/2008
(Continued)

OTHER PUBLICATIONS

International Search Report for PCT/EP2018/074677, dated Jan. 4, 2019.

*Primary Examiner* — Jimmy T Vu
(74) *Attorney, Agent, or Firm* — Norton Rose Fulbright US LLP; Gerard Messina (57) ABSTRACT

A laser projection device that includes at least one laser diode for generating at least one laser beam, and at least one movable mirror element for deflecting the at least one laser beam. The laser projection device includes at least one control and/or regulation unit that is designed to control and/or regulate a brightness of the at least one laser beam as a function of a relative deflection speed of the at least one laser beam.

10 Claims, 3 Drawing Sheets

(51) Int. Cl.
  *H04N 9/31* (2006.01)
  *H05B 47/105* (2020.01)
  *H01S 5/00* (2006.01)

(52) U.S. Cl.
  CPC ......... *H04N 9/3135* (2013.01); *H04N 9/3155* (2013.01); *H04N 9/3161* (2013.01); *H04N 9/3185* (2013.01)

(56) References Cited

U.S. PATENT DOCUMENTS

| | | |
|---|---|---|
| 2012/0120116 A1 | 5/2012 | Seo et al. |
| 2012/0327049 A1 | 12/2012 | Nishimura |
| 2015/0237316 A1* | 8/2015 | Viswanathan ....... G02B 26/101 359/213.1 |

FOREIGN PATENT DOCUMENTS

| | | |
|---|---|---|
| JP | 2006343397 A | 12/2006 |
| WO | 2017121698 A1 | 7/2017 |

* cited by examiner

LASER PROJECTION DEVICE, METHOD FOR OPERATING SAME, AND LASER PROJECTOR

BACKGROUND INFORMATION

A laser projection device that includes at least one laser diode for generating at least one laser beam, and at least one movable mirror element for deflecting the at least one laser beam has already been provided.

SUMMARY

The present invention is directed to a laser projection device that includes at least one laser diode for generating at least one laser beam, and at least one movable mirror element for deflecting the at least one laser beam.

In accordance with the present invention, it is provided that the example laser projection device includes at least one control and/or regulation unit that is configured to control and/or regulate a brightness of the at least one laser beam as a function of a relative deflection speed of the at least one laser beam.

The laser diode preferably generates a laser beam having a frequency from a spectral range of an electromagnetic frequency spectrum that is visible to the human eye. The laser diode preferably generates a laser beam having a frequency from a red spectral range of the electromagnetic frequency spectrum, from a green spectral range of the electromagnetic frequency spectrum, or from a blue spectral range of the electromagnetic frequency spectrum. The laser projection device may preferably include a plurality of laser diodes. The laser projection device may particularly preferably include exactly three laser diodes, a first of the three laser diodes generating a laser beam having a frequency from a red spectral range of the electromagnetic frequency spectrum, a second of the three laser diodes generating a laser beam having a frequency from a green spectral range of the electromagnetic frequency spectrum, and a third of the three laser diodes generating a laser beam having a frequency from a blue spectral range of the electromagnetic frequency spectrum.

A "mirror element" is understood in particular to mean an element that is reflective for electromagnetic radiation, in particular for electromagnetic radiation that is visible to the human eye. In particular, the mirror element is reflective in a range of the electromagnetic frequency spectrum in which the laser projection device emits electromagnetic radiation. The mirror element is preferably made, at least partially, of a material that reflects electromagnetic radiation. The mirror element may be made, in particular at least partially, of a material made of gold, silver, silicon, or some other material that appears meaningful to those skilled in the art, that reflects electromagnetic radiation. Alternatively or additionally, it is possible for the mirror element to include an electromagnetic radiation-reflecting coating on a surface of the mirror element. The coating may preferably be made, at least partially, of a material made of gold, silver, silicon, or some other material that appears meaningful to those skilled in the art, that reflects electromagnetic radiation. For a particularly high reflectance, the mirror element may preferably additionally include a polished, particularly preferably a highly polished, surface. The mirror element is preferably designed as a horizontal mirror which in the laser projection device is configured to project horizontal lines of at least one image. The mirror element is preferably supported so that it is movable about a motion axis of the mirror element.

A "horizontal" direction is understood in particular to mean a direction that extends at least essentially perpendicularly with respect to the motion axis of the mirror element. The term "essentially perpendicularly" is intended here to define in particular an orientation of the direction relative to the motion axis of the mirror element, the direction and the motion axis of the mirror element, in particular viewed in a plane, enclosing an angle of 90°, and the angle having a maximum deviation of in particular less than 8°, advantageously less than 5°, and particularly advantageously less than 2°.

The mirror element is preferably configured to deflect at least one laser beam. "Configured" is understood in particular to mean specially programmed, designed, and/or equipped. The statement that an object is configured for a certain function is understood in particular to mean that the object fulfills and/or carries out this certain function in at least one application state and/or operating state. At least one image may preferably be projected onto a projection surface by deflecting the laser beam.

A "control and/or regulation unit" is understood in particular to mean a unit that includes at least one control electronics system. A "control electronics system" is understood in particular to mean a unit that includes a processor unit and a memory unit, as well as an operating program that is stored in the memory unit. The control and/or regulation unit is preferably configured to control and/or regulate the brightness of the laser beam as a function of the relative deflection speed of the laser beam. For controlling and/or regulating the brightness of the laser beam, the control and/or regulation unit is preferably connected to the laser diode, in particular electroconductively connected. The control and/or regulation unit is configured in particular to control and/or regulate an optical output power of the laser diode as a function of the relative deflection speed of the laser beam. In particular, the optical output power of the laser diode corresponds to the power of the laser beam, and is preferably proportional to the brightness of the laser beam.

A "relative deflection speed of the laser beam" is understood in particular to mean a speed of a laser spot, generated by the laser beam on a projection surface, at a point on a plane of the projection surface relative to a speed of the laser spot at another point on the plane of the projection surface. The laser spot is preferably designed as an intersection point of the laser beam with the projection surface. An absolute deflection speed of the laser beam is preferably irrelevant for controlling and/or regulating the brightness of the laser beam. The relative deflection speed of the laser beam is preferably a function of a relative angular velocity of the mirror element, and in particular is approximately proportional to the relative angular velocity of the mirror element.

Due to the design according to the present invention of the example laser projection device, the brightness of the laser beam may advantageously be controlled and/or regulated as a function of the relative deflection speed of the laser beam. Brightness differences due to differences in the relative deflection speed of the laser beam may advantageously be compensated for in at least one projected image. A homogeneous brightness distribution in the at least one projected image may advantageously be achieved. A laser projection device with correct brightness reproduction of image material may advantageously be provided.

In addition, it is provided in accordance with the present invention that the at least one control and/or regulation unit is configured to control and/or regulate the brightness of the at least one laser beam as a function of the relative deflection speed of the at least one laser beam in such a way that a brightness distribution along a trajectory of the at least one laser beam is homogeneous. A "trajectory of the laser beam" is understood in particular to mean a pattern of the laser spot, generated by the laser beam, on the projection surface with respect to a projection of an image. When there is a homogeneous brightness distribution along the trajectory of the laser beam, an image to be projected that has a homogeneous brightness distribution may preferably be represented by the laser projection device on the projection surface with a homogeneous brightness distribution. An image is built up on the projection surface, preferably line by line, by the laser projection device. The laser beam is preferably rasterized by the mirror element in horizontal lines, which are vertically offset relative to one another, across the projection surface. An image preferably includes a plurality of horizontal lines that are vertically offset relative to one another.

In accordance with the present invention, a rasterization preferably takes place at a fastest relative deflection speed of the laser beam. At a beginning of a line, the mirror element accelerates the laser beam, preferably to the fastest relative deflection speed. The mirror element preferably decelerates at an end of a line. In particular, the laser beam is decelerated to a relative deflection speed that is slower than the fastest relative deflection speed. In areas in which the relative deflection speed of the laser beam is slower than the fastest relative deflection speed, the projection surface in particular is illuminated longer by the laser beam than in the areas in which the laser beam moves at the fastest relative deflection speed. The areas in which the laser beam moves at the fastest relative deflection speed appear on the projection surface in particular darker than the areas in which the laser beam moves at a relative deflection speed that is slower than the fastest relative deflection speed. In particular, a nonhomogeneous brightness distribution results along the trajectory of the at least one laser beam. The control and/or regulation unit may preferably control and/or regulate the brightness of the laser beam as a function of the relative deflection speed of the laser beam in such a way that nonhomogeneity of the brightness distribution is compensated for. The control and/or regulation unit may preferably increase the brightness of the laser beam in the area in which the laser beam moves at the fastest relative deflection speed, and/or the control and/or regulation unit may reduce the brightness of the laser beam in the areas in which the laser beam moves at a relative deflection speed that is slower than the fastest relative deflection speed. An "area" may be understood in particular to mean a sequence of multiple points along a line at a constant relative deflection speed of the laser beam, or of an individual point along a line at a relative deflection speed of the laser beam that is different from adjacent points along the line. In particular, the area in which the laser beam moves at a fastest relative deflection speed may be designed as an individual point in the center of the line. In particular, the laser beam may be accelerated from a beginning of the line directly up to the point in the center of the line, and, beginning at the point in the center of the line, decelerated up to an end of the line. In particular, a pattern of the deflection speed of the laser beam along the line may be described in this case as sinusoidal. In particular, the control and/or regulation unit may control and/or regulate the brightness of the laser beam at each point along the line in such a way that the brightness distribution along the trajectory of the laser beam is homogeneous. A homogeneous brightness distribution along the trajectory of the laser beam may advantageously be achieved.

In addition, in accordance with the present invention, it is provided that the at least one control and/or regulation unit is configured to ascertain the relative deflection speed of the at least one laser beam with the aid of at least one first derivative of at least one warping function, in particular a warping polynomial, of the control and/or regulation unit which describes a distortion of an image field in which the trajectory of the at least one laser beam is situated. The warping function is preferably represented by a polynomial, in particular by the warping polynomial. Alternatively, it is possible for the warping function to be represented by some other mathematical function that appears meaningful to those skilled in the art. A "polynomial" is understood in particular to mean a mathematical function that sums multiples of powers of at least one variable. The warping polynomial is preferably designed as a two-dimensional polynomial. The warping function, in particular the warping polynomial, mathematically describes in particular a distortion of an image field in which the trajectory of the laser beam is situated. From a mathematical standpoint, the warping function, in particular the warping polynomial, represents in particular a mapping rule between a coordinate system of image data, designed as an equidistantly spaced pixel raster, and a distorted coordinate system of the trajectory of the laser beam, designed as a nonequidistantly spaced pixel raster. The image data are preferably data, in particular electronic data, of an image, which are supplied to the laser projection device for projecting the image. In particular the warping function, in particular the warping polynomial, may be stored in the memory unit of the control and/or regulation unit. Mathematically, a first derivative of a path preferably represents a speed along the path. The first derivative of the warping function, in particular of the warping polynomial, preferably provides the deflection speed of the laser beam along the trajectory of the laser beam, in particular the relative deflection speed of the laser beam along the trajectory of the laser beam. In particular for pixels with equal temporal intervals in the coordinate system of the trajectory of the laser beam and pixels with equal spatial intervals in the coordinate system of the image data, the first derivative of the warping function, in particular of the warping polynomial, provides the deflection speed of the laser beam along the trajectory of the laser beam, in particular the relative deflection speed of the laser beam along the trajectory of the laser beam. Equal temporal intervals of the pixels in the coordinate system of the trajectory of the laser beam may preferably be achieved by generating the pixels at a constant generation rate. In particular, a computation program for computing the first derivative of the warping function, in particular of the warping polynomial, may be stored in the memory unit of the control and/or regulation unit. The control and/or regulation unit, in particular the processor unit of the control and/or regulation unit, may preferably compute the first derivative of the warping function, in particular of the warping polynomial, with the aid of the computation program. In particular, the control and/or regulation unit may ascertain the relative deflection speed of the laser beam based on the first derivative of the warping function, in particular of the warping polynomial. Additional sensors for detecting the speed of the mirror element may advantageously be dispensed with. The laser projection device may advantageously be cost-effectively manufactured.

Furthermore, it is provided that the at least one control and/or regulation unit, for an at least essentially one-dimensional movement of the at least one laser beam, is configured to ascertain the relative deflection speed of the at least one laser beam with the aid of at least one first partial derivative of at least one warping function, in particular a warping polynomial, of the control and/or regulation unit which describes a distortion of an image field in which the trajectory of the at least one laser beam is situated. "Essentially one-dimensional movement" is understood in particular to mean a movement along a direction relative to a spatial direction, in particular in a plane, the direction having a deviation in particular less than 8°, advantageously less than 5°, and particularly advantageously less than 2°, from the spatial direction. In particular, the laser beam is rasterized along lines during a buildup of an image on the projection surface. The movement along a line represents in particular a one-dimensional movement. A partial derivative represents in particular a derivative in only one dimension or spatial direction. A derivative of the warping function, in particular of the warping polynomial, in other spatial directions that are different from the spatial direction in which the laser beam at least essentially moves may preferably be dispensed with.

Computing resources may advantageously be saved in ascertaining the relative deflection speed of the laser beam.

Moreover, it is provided that the at least one control and/or regulation unit is configured to ascertain at least one correction factor for correcting the brightness of the at least one laser beam, based on the relative deflection speed of the at least one laser beam. The control and/or regulation unit may preferably ascertain an individual correction factor or a plurality of correction factors. The control and/or regulation unit may preferably ascertain a separate correction factor for each relative deflection speed of the laser beam along a line. The control and/or regulation unit may preferably ascertain the correction factor from the first derivative of the warping polynomial. The control and/or regulation unit is configured in particular to control and/or regulate the laser diode by transmitting control data. The control and/or regulation unit may preferably incorporate the correction factor into the control data. In particular, the laser diode may generate a laser beam with corrected brightness based on the control and/or regulation with the aid of corrected control data. Additional components for a brightness correction of the laser beam, such as diaphragms or filters, may advantageously be dispensed with. The laser projection device may advantageously be cost-effectively manufactured.

In addition, it is provided that the at least one control and/or regulation unit is configured to normalize the correction of the brightness of the at least one laser beam for the fastest relative deflection speed of the at least one laser beam to the value 1, with the aid of a normalization factor. In particular, the brightness of the laser beam for the fastest relative deflection speed of the laser beam is regarded as a reference brightness. In particular, the correction factor for the reference brightness is normalized to the value 1. The brightness of the laser beam for the fastest deflection speed of the laser beam preferably remains unchanged by the correction factor. The brightnesses of the laser beam for relative deflection speeds of the laser beam that are slower than the fastest relative deflection speed of the laser beam are preferably adapted by the correction coefficient. The reference brightness may advantageously be defined.

In addition, it is provided that the at least one control and/or regulation unit is configured to reduce the brightness of the at least one laser beam in at least one area of reversal points of a movement of the at least one laser beam. The brightness of the laser beam is preferably reduced in the area of the reversal points of the movement of the laser beam by applying the correction factor. The brightness of the laser beam in the area of the reversal points of the movement of the laser beam is preferably reduced to a value less than 1, based on the normalization factor. In particular, the movement of the laser beam includes at least two areas of reversal points per line. A first area around a first reversal point preferably marks a line beginning. A second area around a second reversal point preferably marks a line end. Due to an acceleration and/or a deceleration of the movement of the laser beam in these areas, the laser beam moves in these areas in particular more slowly than in a line center. In particular, the areas around the reversal points are illuminated longer by the laser beam than areas in the line center. In particular, the areas around the reversal points have a greater brightness in the projected image than the areas in the line center.

A uniform illumination along the line may preferably be achieved by reducing the brightness of the laser beam in the area of the reversal points of the movement of the laser beam. In particular, the area in which the laser beam moves at a fastest relative deflection speed may be designed as an individual point in the center of the line. In particular, the laser beam may be accelerated from a beginning of the line directly up to the point in the center of the line, and, beginning directly at the point in the center of the line, decelerated up to an end of the line. In particular, the movement of the laser beam in this case may include a plurality of areas around the first reversal point, which are situated along the line from the line beginning up to the point in the line center. In particular, the movement of the laser beam in this case may include a plurality of areas around the second reversal point, which are situated from the point in the line center up to the line end. The areas may preferably be designed as individual points. In particular, the control and/or regulation unit may reduce, in particular individually reduce, the brightness of the laser beam in each area of the reversal points in such a way that the brightness distribution along the trajectory of the laser beam is homogeneous. Brightness differences between the areas around the reversal points and the areas in the line center may advantageously be compensated for.

Moreover, the present invention is directed to a method for operating a laser projection device according to the present invention, the laser projection device including at least one laser diode for generating at least one laser beam, and at least one movable mirror element for deflecting the at least one laser beam.

In accordance with the present invention, it is provided that, in particular in at least one method step, a brightness of the at least one laser beam is controlled and/or regulated as a function of a relative deflection speed of the at least one laser beam. Brightness differences due to differences in the relative deflection speed of the laser beam in at least one projected image may advantageously be compensated for.

In addition, in accordance with the present invention, it is provided that, in particular in at least one method step, the brightness of the at least one laser beam is controlled and/or regulated as a function of the relative deflection speed of the at least one laser beam in such a way that a brightness distribution along a trajectory of the at least one laser beam is homogeneous. A homogeneous brightness distribution along the trajectory of the laser beam may advantageously be achieved.

Moreover, the present invention is directed to a laser projector that includes at least one laser projection device according to the present invention, the laser projection device including at least one laser diode for generating at least one laser beam and at least one movable mirror element for deflecting the at least one laser beam. The laser projector preferably includes even further components that are necessary for operating the laser projector. In particular, the laser projector may include at least one power supply, at least one data input, at least one image processor, at least one housing, and other components that appear meaningful to those skilled in the art. A laser projector may advantageously be provided that may homogeneously illuminate a projection surface.

The laser projection device according to the present invention, the method according to the present invention, and/or the laser projector according to the present invention are/is not intended to be limited to the application and specific embodiment described above. In particular, for implementing an operating principle described herein, the laser projection device according to the present invention, the method according to the present invention, and/or the laser projector according to the present invention may include a number of individual elements, components, and units as well as method steps that is different from a number stated herein. In addition, for the value ranges given in the present disclosure, values within the stated limits are also considered to be disclosed and usable as desired.

BRIEF DESCRIPTION OF THE DRAWINGS

Further advantages result from the description below of the figures. One exemplary embodiment of the present invention is illustrated in the figures. The figures and the description contain numerous features in combination. Those skilled in the art will also advantageously consider the features individually and combine them into further meaningful combinations.

DETAILED DESCRIPTION OF EXAMPLE EMBODIMENTS

Figure 1:
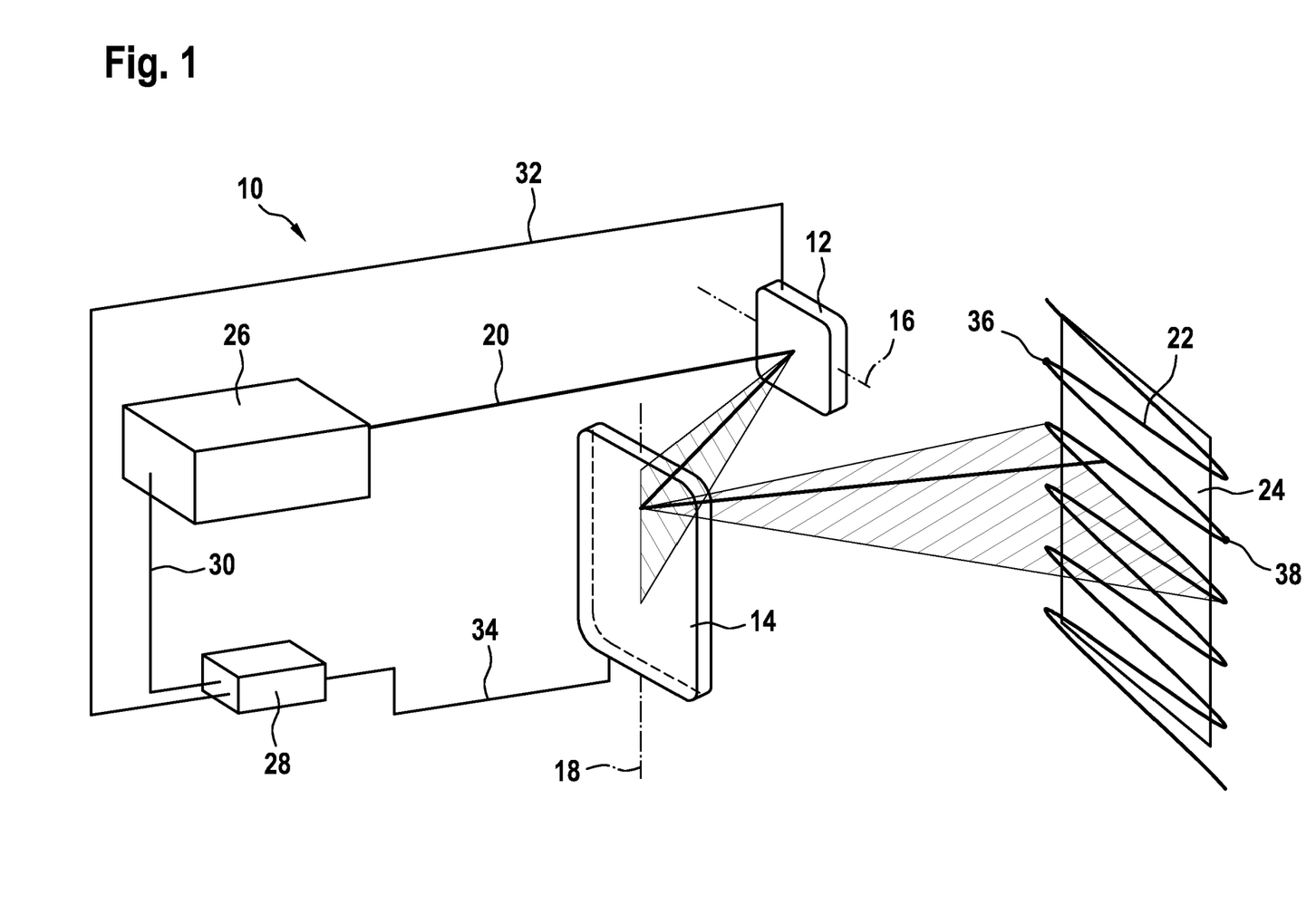
FIG. 1 shows an example laser projection device according to the present invention in a schematic illustration.

FIG. 1 shows an example laser projection device 10 according to the present invention in a schematic illustration. Laser projection device 10 includes a first mirror element 12 and a second mirror element 14. First mirror element 12 is designed as a vertical mirror, and is supported so that it is movable about a first motion axis 16. Second mirror element 14 is designed as a horizontal mirror, and is supported so that it is movable about a second motion axis 18. First motion axis 16 and second motion axis 18 are oriented perpendicularly with respect to one another.

First mirror element 12 is configured to deflect a laser beam 20 in a vertical direction. Second mirror element 14 is configured to deflect laser beam 20, deflected by first mirror element 12, in a horizontal direction. Second mirror element 14 is illustrated in a partially transparent manner to clearly depict an operating principle of second mirror element 14. Via laser beam 20 that is deflected from the two mirror elements 12, 14, laser projection device 10 projects an image 22 onto a projection surface 24. Laser beam 20 is generated by a laser diode 26 of laser projection device 10.

The two mirror elements 12, 14 have a coating on their respective surfaces that is reflective for electromagnetic radiation. The reflective coating is made of gold.

Alternatively, the reflective coating may also be made of a material made of silver, silicon, or some other material that appears meaningful to those skilled in the art, that reflects electromagnetic radiation. The surfaces of the two mirror elements 12, 14 are each highly polished for a high reflectance.

Laser projection device 10 includes a control and/or regulation unit 28. Control and/or regulation unit 28 is configured to control and/or regulate a brightness of laser beam 20 as a function of a relative deflection speed of laser beam 20. For controlling and/or regulating the brightness of laser beam 20, control and/or regulation unit 28 is connected to laser diode 26 via a first electrical line 30. Control and/or regulation unit 28 may adapt an optical output power of laser diode 26 via electrical line 30. The optical output power of laser diode 26 is proportional to the brightness of laser beam 20. Control and/or regulation unit 28 is preferably connected to first mirror element 12 via a second electrical line 32, and is connected to second mirror element 14 via a third electrical line 34. Control and/or regulation unit 28 may detect positions of the two mirror elements 12, 14 via second electrical line 32 and via third electrical line 34, respectively, on the basis of which control and/or regulation unit 28 may ascertain a position of laser beam 20. In addition, control and/or regulation unit 28 is configured to provide the two mirror elements 12, 14 with drive signals for a movement control. Control and/or regulation unit 28 may provide drive signals to first mirror element 12 via second electrical line 32, and may provide drive signals to second mirror element 14 via third electrical line 34. Alternatively, it is possible for laser projection device 10 to include a further control and/or regulation unit that is configured to provide the two mirror elements 12, 14 with drive signals for a movement control. The further control and/or regulation unit may transmit time pulses or synchronous pulses to control and/or regulation unit 28 via a further electrical line, on the basis of which control and/or regulation unit 28 may ascertain a position of laser beam 20.

Control and/or regulation unit 28 is configured to control and/or regulate the brightness of laser beam 20 in such a way that a brightness distribution along a trajectory of laser beam 20 is homogeneous. Image 22 is built up on projection surface 24 along the trajectory of laser beam 20. When the brightness distribution is homogeneous along the trajectory of laser beam 20, image 22 has a homogeneous brightness distribution.

Control and/or regulation unit 28 is configured to ascertain the relative deflection speed of laser beam 20 with the aid of a first derivative of a warping function of control and/or regulation unit 28. Control and/or regulation unit 28 is configured to ascertain the relative deflection speed of laser beam 20 with the aid of a first derivative of a warping polynomial of control and/or regulation unit 28. The warping polynomial is stored in a memory unit of control and/or regulation unit 28. The warping polynomial is a mathematical description of a distortion of an image field in which the trajectory of laser beam 20 is situated. The first derivative of the warping polynomial provides the relative deflection speed of laser beam 20. A processor unit of control and/or regulation unit 28 may compute the first derivative of the warping polynomial with the aid of a computation program stored in the memory unit of control and/or regulation unit 28. Control and/or regulation unit 28 ascertains the relative deflection speed of laser beam 20 based on the first derivative of the warping polynomial.

In the present exemplary embodiment, first mirror element 12 is moved at a negligibly slow rate in comparison to a speed of second mirror element 14. A path in the vertical direction that laser beam 20 covers per line is negligibly short in comparison to the path in the horizontal direction that laser beam 20 covers per line. Laser beam 20 carries out an at least essentially equal one-dimensional movement per line. For an at least essentially one-dimensional movement of laser beam 20, control and/or regulation unit 28 is configured to ascertain the relative deflection speed of laser beam 20 with the aid of a first partial derivative of the warping function. Control and/or regulation unit 28 is configured to ascertain the relative deflection speed of laser beam 20 with the aid of a first partial derivative of the warping polynomial. A first derivative of the warping polynomial in a spatial direction in which laser beam 20 moves, is sufficient to ascertain the relative deflection speed of laser beam 20 in this spatial direction. In the present exemplary embodiment, control and/or regulation unit 28 ascertains the relative deflection speed of laser beam 20 with the aid of the first derivative of a horizontal component of the warping polynomial.

For controlling and/or regulating the optical output power of laser diode 26, control and/or regulation unit 28 transmits control data to laser diode 26 via first electrical line 30. Control and/or regulation unit 28 is configured to ascertain a correction factor for correcting the brightness of laser beam 20, based on the relative deflection speed of laser beam 20. Control and/or regulation unit 28 is configured to incorporate the correction factor into the control data. Control and/or regulation unit 28 may adapt the optical output power of laser diode 26 with the aid of the corrected control data in such a way that the brightness of laser beam 20 is corrected.

Control and/or regulation unit 28 is configured to normalize the correction of the brightness of laser beam 20 for the fastest relative deflection speed of laser beam 20 to the value 1, with the aid of a normalization factor. Control and/or regulation unit 28 incorporates such a normalization factor into the correction coefficient in such a way that the correction coefficient for correcting the brightness of laser beam 20 for the fastest relative deflection speed of laser beam 20 results in the value 1. The brightness of laser beam 20 for the fastest relative deflection speed of laser beam 20 is a reference brightness for the brightness in the line.

In each line, the movement of laser beam 20 includes a first area around a first reversal point 36 and a second area around a second reversal point 38 of the movement of laser beam 20. First reversal point 36 is situated at a beginning of a line, and second reversal point 38 is situated at an end of a line. At the two reversal points 36, 38, laser beam 20 is accelerated in a first direction and decelerated in a second direction opposite from the first direction. In the area of the two reversal points 36, 38, laser beam 20 moves at a slower relative deflection speed than the fastest relative deflection speed. The areas around two reversal points 36, 38 are brighter than areas with the fastest relative deflection speed of laser beam 20. To adjust the brightness in the areas around reversal points 36, 38 to the reference brightness with the fastest relative deflection speed, control and/or regulation unit 28 is configured to reduce the brightness of laser beam 20 in the areas of reversal points 36, 38 of the movement of laser beam 20.

An example method for operating laser projection device 10 is described below. In at least one method step, the brightness of laser beam 20 is controlled and/or regulated as a function of the relative deflection speed of laser beam 20. In at least one further method step, the brightness of laser beam 20 is controlled and/or regulated as a function of the relative deflection speed of laser beam 20 in such a way that a brightness distribution along the trajectory of laser beam 20 is homogeneous. With regard to further method steps of the method for operating laser projection device 10, reference may be made to the above description of laser projection device 10, since this description is also to be similarly understood for the method, and therefore all features with regard to laser projection device 10 are also regarded as disclosed with respect to the method for operating laser projection device 10.

Figure 2:
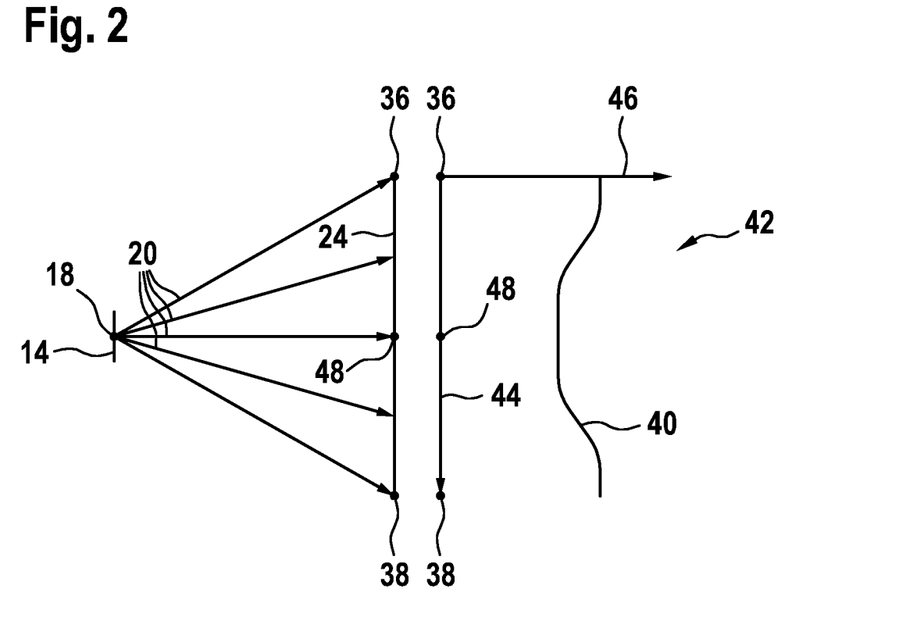
FIG. 2 shows an uncorrected brightness distribution in a schematic illustration.

FIG. 2 shows an uncorrected brightness distribution 40 in a schematic illustration. Second mirror element 14, shown in a schematic top view, rasters laser beam 20 along a line across projection surface 24. The rasterization of laser beam 20 is indicated by five laser beams 20 that are deflected onto various points along the line. Second mirror element 14 is supported so that it is movable about second motion axis 18. A coordinate system 42 is also illustrated. Coordinate system 42 includes an abscissa axis 44 and an ordinate axis 46. An extension of projection surface 24 in the horizontal direction is plotted on abscissa axis 44. The uncorrected brightness of laser beam 20 is plotted on ordinate axis 46. Connecting the uncorrected brightnesses of laser beam 20 for each point on the horizontal extension of projection surface 24 results in a curve of uncorrected brightness distribution 40 along the line. Uncorrected brightness distribution 40 has a nonlinear curve along the line. The brightness of laser beam 20 in the areas of reversal points 36, 38 of the movement of laser beam 20 is greater than the brightness of laser beam 20 in the area around a line center 48. Uncorrected brightness distribution 40 is nonhomogeneous.

Figure 3:
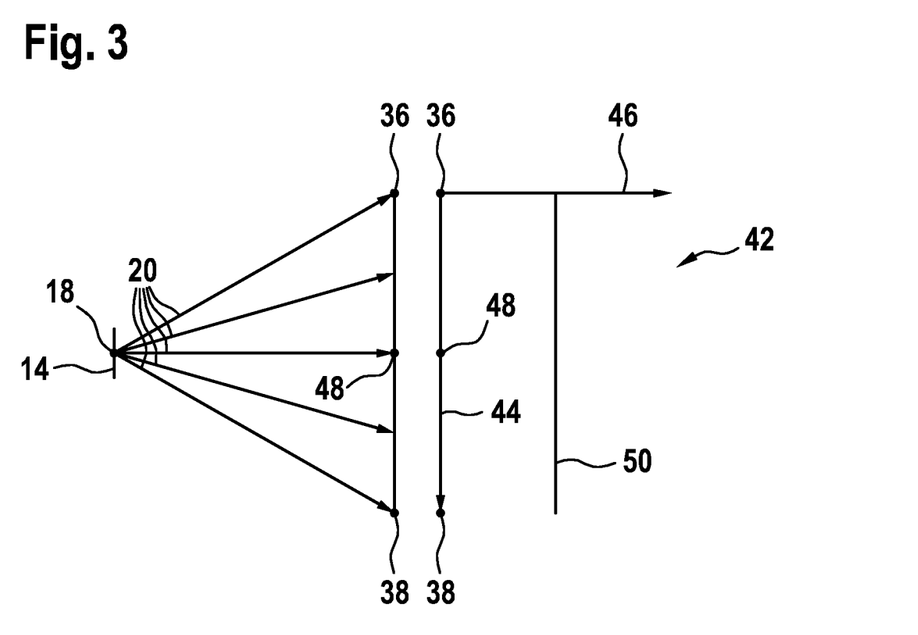
FIG. 3 shows a corrected brightness distribution in a schematic illustration.

FIG. 3 shows a corrected brightness distribution 50 in a schematic illustration. The brightness of laser beam 20 is corrected based on the relative deflection speed of laser beam 20. Second mirror element 14, shown in a schematic top view, rasters laser beam 20 along a line across projection surface 24. The rasterization of laser beam 20 is indicated by five laser beams 20 that are deflected onto various points along the line. Second mirror element 14 is supported so that it is movable about second motion axis 18. Coordinate system 42 is also illustrated. Coordinate system 42 includes abscissa axis 44 and ordinate axis 46. The extension of projection surface 24 in the horizontal direction is plotted on abscissa axis 44. The corrected brightness of laser beam 20 is plotted on ordinate axis 46. Connecting the corrected brightnesses of laser beam 20 for each point on the horizontal extension of projection surface 24 results in a curve of corrected brightness distribution 50 along the line. Corrected brightness distribution 50 has a linear curve along the line. The brightness of laser beam 20 in the areas of reversal points 36, 38 of the movement of laser beam 20 is reduced in comparison to uncorrected brightness distribution 40. The brightness of laser beam 20 in the areas of reversal points 36, 38 of the movement of laser beam 20 is just as great as the brightness of laser beam 20 in the area around a line center 48. Corrected brightness distribution 50 is homogeneous.

Figure 4:
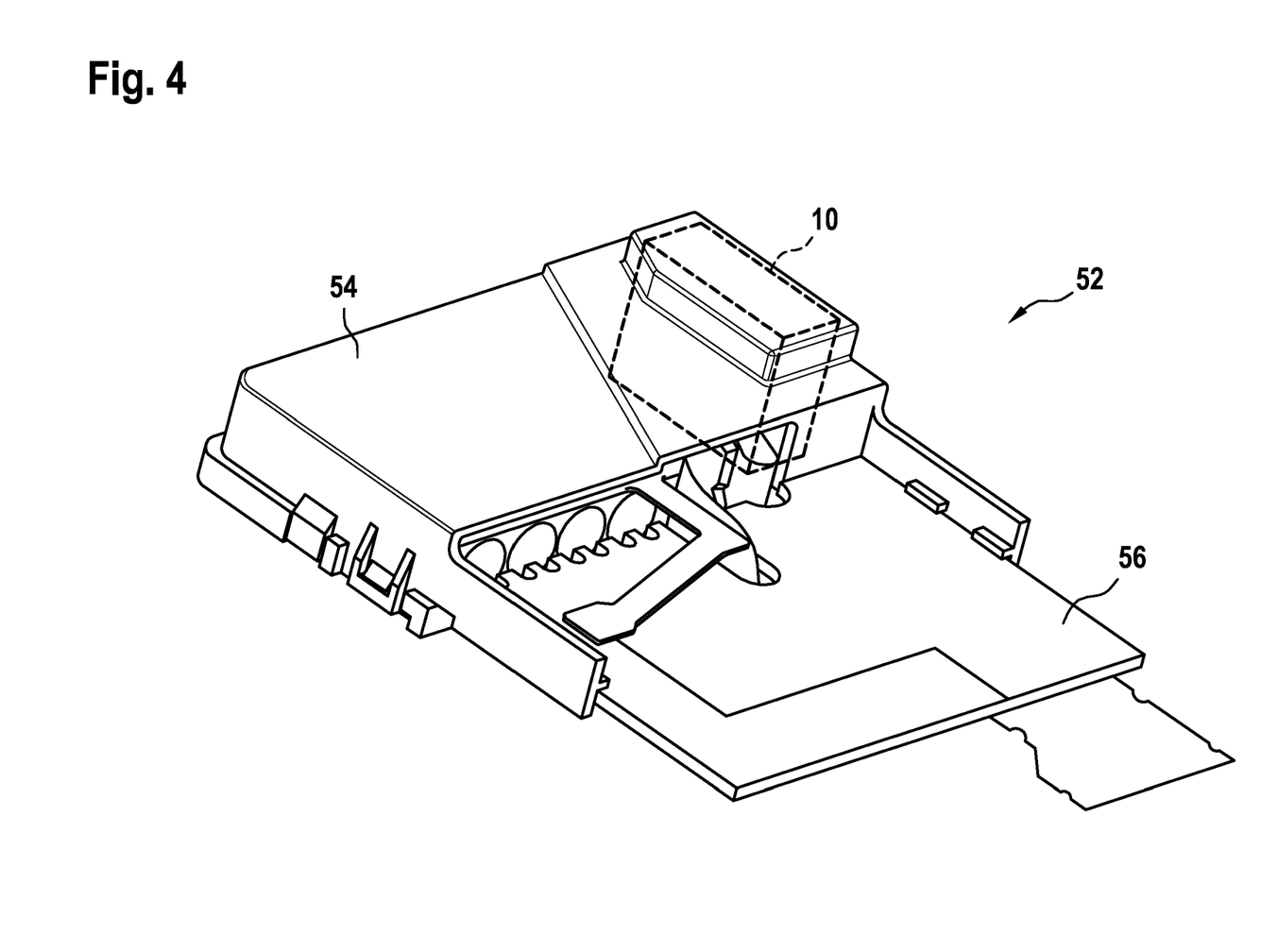
FIG. 4 shows a laser projector according to the present invention in a perspective illustration.

FIG. 4 shows a laser projector 52 according to the present invention in a perspective illustration. Laser projector 52 includes laser projection device 10. Laser projection device 10 is situated within a housing 54 of laser projector 52 and indicated by an area that is bordered by a dashed line. Laser projection device 10 is situated on a motherboard 56 of laser projector 52.

What is claimed is:

1. A laser projection device, comprising:
   at least one laser diode configured to generate at least one laser beam;
   at least one movable mirror element configured to deflect the at least one laser beam; and
   at least one control and/or regulation unit configured to control and/or regulate a brightness of the at least one laser beam as a function of a relative deflection speed of the at least one laser beam,
   wherein the at least one control and/or regulation unit is configured to control and/or regulate the brightness of the at least one laser beam as a function of the relative deflection speed of the at least one laser beam in such a way that a brightness distribution along a trajectory of the at least one laser beam is homogeneous,
   wherein the at least one laser beam is rasterized by the at least one movable mirror element in horizontal lines which are vertically offset relative to one another across a projection surface.

2. The laser projection device as recited in claim 1, wherein the at least one control and/or regulation unit is configured to ascertain at least one correction factor for correcting the brightness of the at least one laser beam, based on the relative deflection speed of the at least one laser beam.

3. The laser projection device as recited in claim 2, wherein the at least one control and/or regulation unit is configured to normalize the correction of the brightness of the at least one laser beam for the fastest relative deflection speed of the at least one laser beam to the value 1, using a normalization factor.

4. The laser projection device as recited in claim 1, wherein the at least one control and/or regulation unit is configured to reduce the brightness of the at least one laser beam in at least one area of reversal points of a movement of the at least one laser beam.

5. A laser projection device, comprising:
   at least one laser diode configured to generate at least one laser beam;
   at least one movable mirror element configured to deflect the at least one laser beam; and
   at least one control and/or regulation unit configured to control and/or regulate a brightness of the at least one laser beam as a function of a relative deflection speed of the at least one laser beam,
   wherein the at least one control and/or regulation unit is configured to ascertain the relative deflection speed of the at least one laser beam using at least one first derivative of at least one warping function of the control and/or regulation unit which describes a distortion of an image field in which the trajectory of the at least one laser beam is situated.

6. The laser projection device as recited in claim 5, wherein the at least one warping function includes a warping polynomial.

7. A laser projection device, comprising:
   at least one laser diode configured to generate at least one laser beam;
   at least one movable mirror element configured to deflect the at least one laser beam; and
   at least one control and/or regulation unit configured to control and/or regulate a brightness of the at least one laser beam as a function of a relative deflection speed of the at least one laser beam,
   wherein the at least one control and/or regulation unit, for an at least essentially one-dimensional movement of the at least one laser beam, is configured to ascertain the relative deflection speed of the at least one laser beam using at least one first partial derivative of at least one warping function of the control and/or regulation unit which describes a distortion of an image field in which the trajectory of the at least one laser beam is situated.

8. The laser projection device as recited in claim 7, wherein the at least one warping function includes a warping polynomial.

9. A method for operating a laser projection device, the laser projection device including at least one laser diode configured to generate at least one laser beam, and at least one movable mirror element configured to deflect the at least one laser beam, the method comprising:
   controlling and/or regulating a brightness of the at least one laser beam as a function of a relative deflection speed of the at least one laser beam,
   wherein the brightness of the at least one laser beam is controlled and/or regulated as a function of the relative deflection speed of the at least one laser beam in such a way that a brightness distribution along a trajectory of the at least one laser beam is homogeneous,
   wherein the at least one laser beam is rasterized by the at least one movable mirror element in horizontal lines which are vertically offset relative to one another across a projection surface.

10. A laser projector, comprising:
    at least one laser projection device including at least one laser diode configured to generating at least one laser beam, at least one movable mirror element configured to deflect the at least one laser beam, and at least one control and/or regulation unit configured to control and/or regulate a brightness of the at least one laser beam as a function of a relative deflection speed of the at least one laser beam,
    wherein the at least one control and/or regulation unit is configured to control and/or regulate the brightness of the at least one laser beam as a function of the relative deflection speed of the at least one laser beam in such a way that a brightness distribution along a trajectory of the at least one laser beam is homogeneous,
    wherein the at least one laser beam is rasterized by the at least one movable mirror element in horizontal lines which are vertically offset relative to one another across a projection surface.

* * * * *